(12) United States Patent
Kim et al.

(10) Patent No.: US 8,941,100 B2
(45) Date of Patent: Jan. 27, 2015

(54) ORGANIC LIGHT EMITTING DISPLAY APPARATUS AND METHOD OF MANUFACTURING THE SAME

(71) Applicants: Kang-Hyun Kim, Yongin (KR); Hyun-Ju Lee, Yongin (KR)

(72) Inventors: Kang-Hyun Kim, Yongin (KR); Hyun-Ju Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/921,277

(22) Filed: Jun. 19, 2013

(65) Prior Publication Data

US 2014/0231757 A1 Aug. 21, 2014

(30) Foreign Application Priority Data

Feb. 19, 2013 (KR) .................. 10-2013-0017274

(51) Int. Cl.
- *H01L 29/08* (2006.01)
- *H01L 51/50* (2006.01)
- *H01L 51/56* (2006.01)

(52) U.S. Cl.
CPC ............ *H01L 51/5092* (2013.01); *H01L 51/56* (2013.01)
USPC .............................................. 257/40; 438/82

(58) Field of Classification Search
CPC ........... H01L 51/5076; H01L 51/5072; H01L 51/5064; H01L 51/5092
USPC ................................................ 257/40; 438/82
See application file for complete search history.

(56) References Cited

U.S. PATENT DOCUMENTS

| | | | |
|---|---|---|---|
| 2004/0058193 A1 | | 3/2004 | Hatwar |
| 2005/0282302 A1* | | 12/2005 | Yamazaki et al. .............. 438/21 |
| 2006/0251920 A1 | | 11/2006 | Aziz et al. |
| 2011/0057176 A1* | | 3/2011 | Kang et al. ....................... 257/40 |
| 2013/0048956 A1* | | 2/2013 | Balaganesan et al. .......... 257/40 |
| 2013/0099224 A1* | | 4/2013 | Iijima et al. ..................... 257/40 |
| 2013/0228753 A1* | | 9/2013 | Moon et al. ..................... 257/40 |

FOREIGN PATENT DOCUMENTS

| | | |
|---|---|---|
| KR | 10-2004-0024847 A | 3/2004 |
| KR | 10-2006-0115663 A | 11/2006 |
| KR | 10-2012-0064256 A | 6/2012 |

* cited by examiner

*Primary Examiner* — Douglas Menz
(74) *Attorney, Agent, or Firm* — Lee & Morse, P.C.

(57) ABSTRACT

An organic light emitting display apparatus includes a first electrode, a hole injection layer disposed on the first electrode, a light emitting layer disposed on the hole injection layer, an electron injection layer disposed on the light emitting layer, a chlorine-doped layer disposed on the electrode injection layer and including chlorine and a same material as the electron injection layer, and a second electrode disposed on the chlorine-doped layer.

20 Claims, 9 Drawing Sheets

ORGANIC LIGHT EMITTING DISPLAY APPARATUS AND METHOD OF MANUFACTURING THE SAME

CROSS-REFERENCE TO RELATED APPLICATION(S)

This application claims the benefit of and priority under 35 U.S.C. §119 to Korean Patent Application No. 10-2013-0017274, filed on Feb. 19, 2013, in the Korean Intellectual Property Office, and entitled: "ORGANIC LIGHT EMITTING DISPLAY APPARATUS AND METHOD OF MANUFACTURING THE SAME," which is incorporated by reference herein in its entirety.

BACKGROUND

1. Field

Example embodiments relate to an organic light emitting display apparatus and a method of manufacturing the organic light emitting display apparatus.

2. Description of the Related Art

An organic light emitting display apparatus (OLED) is one of an active type flat panel display apparatus displaying an image using an organic light emitting element that generates light. The OLED has various characteristics such as low power consumption, thin thickness, small size, etc. Also, the OLED has high color reproducibility and good response speed. Thus, the OLED is capable of displaying an image of a good image display quality.

SUMMARY

Embodiments are directed to an organic light emitting display apparatus, including a first electrode, a hole injection layer disposed on the first electrode, a light emitting layer disposed on the hole injection layer, an electron injection layer disposed on the light emitting layer, a chlorine-doped layer disposed on the electrode injection layer and including chlorine and a same material as the electron injection layer, and a second electrode disposed on the chlorine-doped layer.

The organic light emitting display apparatus may further include an electron transportation layer interposed between the light emitting layer and the electron injection layer.

The organic light emitting display apparatus may further include a hole transportation layer interposed between the hole injection layer and the light emitting layer.

The electron injection layer may include at least one selected from the group of Alq3, PBD, PF-6P, PyPysPyPy, LiF, NaCl, CaF, $Li_2O$, BaO, and Liq.

The chlorine-doped layer may include chlorine and at least one selected from the group of Alq3, PBD, PF-6P, PyPysPyPy, LiF, NaCl, CaF, $Li_2O$, BaO, and Liq.

Chlorine concentration in the chlorine-doped layer may be maximum at a boundary between the chlorine-doped layer and the second electrode.

The chlorine concentration in the chlorine-doped layer may decrease as a distance from the boundary between the chlorine-doped layer and the second electrode increases.

The second electrode may include a transparent conductive material.

The second electrode may include a highly reflective material.

The second electrode may include chlorine.

The organic light emitting display apparatus may further include a thin film transistor electrically coupled to the first electrode, a base substrate supporting the thin film transistor, and a protection layer covering the second electrode.

Embodiments are also directed to a method of manufacturing an organic light emitting display apparatus, the method including forming a first electrode on a base substrate, forming a hole injection layer on the first electrode, forming a light emitting layer on the hole injection layer, forming a primitive electron injection layer on the light emitting layer, doping chlorine on an upper portion of the primitive electron injection layer to form a chlorine-doped layer at the upper portion of the primitive electron injection layer and an electron injection layer at a remaining portion of the primitive electron injection layer, the chlorine-doped layer including the chlorine and a same material as the primitive electron injection layer, and forming a second electrode on the chlorine-doped layer.

The method may further include forming a hole transportation layer on the hole injection layer, wherein the light emitting layer is formed on the hole transportation layer.

The method may further include forming an electron transportation layer on the light emitting layer, wherein the primitive electron injection layer is formed on the electron transportation layer.

The primitive electron injection layer may be formed by depositing at least one selected from the group of PBD, PF-6P, PyPySPyPy, LiF, CaF, $Li_2O$, BaO, and Liq.

The chlorine-doped layer may be formed from the electron injection layer using chlorine gas or a chlorine composition gas.

Embodiments are also directed to a method of manufacturing an organic light emitting display apparatus, the method including forming a first electrode on a base substrate, forming a hole injection layer on the first electrode, forming a light emitting layer on the hole injection layer, forming a primitive electron injection layer on the light emitting layer, and depositing a conductive material on the primitive electron injection layer in a chlorine atmosphere to form a chlorine-doped layer at an upper portion of the primitive electron injection layer, an electron injection layer at a remaining portion of the primitive electron injection layer, and a second electrode on the chlorine-doped layer, the chlorine-doped layer including the chlorine and a same material as the primitive electron injection layer.

The chlorine-doped layer, the electron injection layer, and the second electrode may be formed in-situ.

The chlorine-doped layer, the electron injection layer, and the second electrode may be formed by depositing a transparent conductive material on the primitive electron injection layer in a chlorine gas or chlorine composition gas atmosphere.

The chlorine-doped layer, the electron injection layer, and the second electrode may be formed by depositing a highly reflective metal on the primitive electron injection layer in a chlorine gas or chlorine composition gas atmosphere.

BRIEF DESCRIPTION OF THE DRAWINGS

Features will become apparent to those of skill in the art by describing in detail example embodiments with reference to the attached drawings in which.

DETAILED DESCRIPTION

Figure 1:
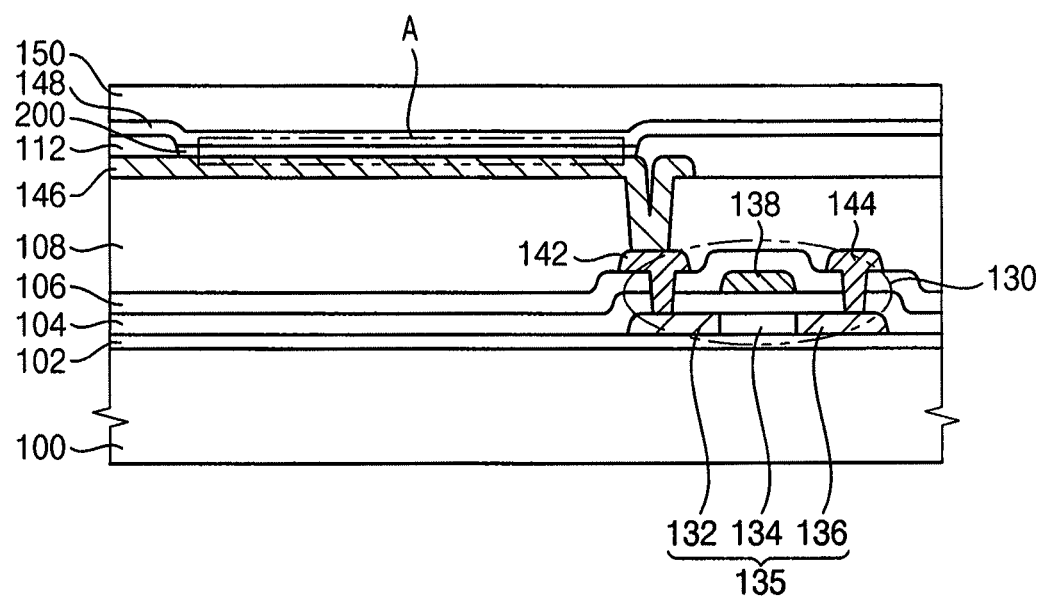
FIG. 1 is a cross-sectional view illustrating an organic light emitting display apparatus (OLED) according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. Like reference numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display apparatus (OLED) according to an example embodiment.

Referring to FIG. 1, the OLED includes a base substrate 100, a buffer layer 102, a gate insulating layer 104, an insulating interlayer 106, a planarizing layer 108, a pixel defining layer 112, a thin film transistor (TFT) 130, a first electrode 146, a second electrode 148, an organic light emitting element 200 and a protecting layer 150.

The base substrate 100 may include a transparent insulating substrate. For example, the base substrate 100 may include a glass substrate, a quartz substrate, a transparent resin substrate including a transparent resin, etc. Examples of a transparent resin that may be used for the base substrate 100 may include a polyimide resin, an acrylic resin, a polyacrylate resin, a polycarbonate resin, a polyether resin, a polyethylene terephthalate resin, a sulfonic acid based resin, etc.

The buffer layer 102 is disposed on the base substrate 100, and includes an insulating material. Examples of the insulating material that may be used for the buffer layer 102 may include an inorganic insulating material such as silicon oxide ($SiO_x$), silicon nitride ($SiN_x$), silicon oxynitride ($SiO_xN_y$), silicon carbon-oxide ($SiO_xC_y$), silicon carton-nitride ($SiC_xN_y$), etc. The inorganic insulating material may be used alone, in a combination thereof, in a mixture thereof, or in a stacked structure thereof. When the buffer layer 102 includes the stacked structure, the buffer layer 102 may have a multi-layered structure including a silicon oxide layer, a silicon nitride layer, a silicon oxynitride layer, a silicon carton-oxide layer, and/or a silicon carbon-nitride layer.

The buffer layer 102 helps prevent diffusion of metal atoms or impurities from the base substrate 100 and may help control speed of heat transfer during subsequent crystallization process for an active pattern 135. Thus, electric characteristics of the active pattern 135 may be improved. Also, the buffer layer 102 helps planarize a surface of the base substrate 100.

The active pattern 135 is disposed on the buffer layer 102. For example, the active pattern 135 may include polysilicon. The active pattern 135 includes a drain contact portion 132, a source contact portion 136, and a channel portion 134. The drain contact portion 132 makes contact with a drain electrode 142 of a thin film transistor 130. The source contact portion 136 makes contact with a source electrode 144 of the thin film transistor 130. The channel portion 134 is interposed between the drain contact portion 132 and the source contact portion 136.

The gate insulating layer 104 is disposed on the buffer layer 102 on which the active pattern 135 is formed to electrically insulate the active pattern 135 from the gate electrode 138 and a gate line (not shown). The gate insulating layer 104 may include silicon nitride, metal oxide, etc. Examples of an insulating material that may be used for the gate insulating layer 104 may include hafnium oxide ($HfO_x$), aluminum oxide ($AlO_x$), zirconium oxide ($ZrO_x$), titanium oxide ($TiO_x$), tantalum oxide (TaO$_x$), etc. These may be used alone, in a combination thereof, in a mixture thereof, or in a stacked structure thereof. The gate insulating layer 104 may include a plurality of contact holes through which the source contact portion 136 and the drain contact portion 132 are exposed.

The gate electrode 138 is disposed on the gate insulating layer 104. The gate electrode 138 is disposed on the channel portion 134 of the active pattern 135. When a voltage difference is formed between the gate electrode 138 and the source electrode 144, the thin film transistor 130 is turned on so that a current flows through the channel portion 134 toward the drain electrode 142.

The gate electrode 138 may include a conductive material such as a metal, an alloy, a metal nitride, a conductive metal oxide, a transparent conductive material, etc. Examples of the conductive material that may be used for the gate electrode 138 may include aluminum, aluminum alloy, aluminum nitride (AlN$_x$), silver (Ag), silver alloy, tungsten (W), tungsten nitride (WN$_x$), copper, copper alloy, nickel (Ni), chromium (Cr), chromium nitride (CrN$_x$), molybdenum (Mo), molybdenum alloy, titanium (Ti), titanium nitride (TiNx), platinum (Pt), tantalum (Ta), tantalum nitride (TaN$_x$), neodymium (Nd), scandium (Sc), strontium ruthenium oxide (SRO), zinc oxide (ZnO$_x$), indium tin oxide (ITO), tin oxide (SnO$_x$), indium oxide (InO$_x$), gallium oxide (GaO$_x$), indium zinc oxide (IZO), etc. These may be used alone or in a combination thereof. Also, the gate electrode 138 may have a mono-layered structure or a multi-layered structure including a metal layer, an alloy layer, a metal nitride layer, a conductive metal oxide layer, and/or a transparent conductive material layer.

The gate line (not shown) is formed from a same layer as the gate electrode 138 to be electrically connected to the gate electrode 138.

The insulating interlayer 106 is formed on the gate insulating layer 104 on which the gate electrode 138 and the gate line (not shown) are formed. The insulating interlayer 106 insulates the gate electrode 138 and the gate line (not shown) from the source electrode 144 and the drain electrode 142.

The insulating interlayer 106 may include a silicon compound. Examples of an insulating material that may be used for the insulating interlayer 106 may include silicon oxide, silicon nitride, silicon oxynitride, silicon carbon-nitride, silicon carbon-oxide, etc. These may be used alone or in a combination thereof. The insulating interlayer 106 has a plurality of contact holes through which the source portion 136 and the drain portion 132 of the active pattern 135 are exposed.

The source electrode 144 and the drain electrode 142 are formed on the insulating interlayer 106. The source electrode 144 and the drain electrode 142 make contact with the source portion 136 and the drain portion 132 of the active pattern 135, respectively.

The source and drain electrodes 144 and 142 may include a conductive material such as a metal, an alloy, a metal nitride, a conductive metal oxide, a transparent conductive material, etc. Examples of the conductive material that may be used for the source and drain electrodes 144 and 142 may include aluminum, aluminum alloy, aluminum nitride (AlN$_x$), silver (Ag), silver alloy, tungsten (W), tungsten nitride (WN$_x$), copper, copper alloy, nickel (Ni), chromium (Cr), chromium nitride (CrN$_x$), molybdenum (Mo), molybdenum alloy, titanium (Ti), titanium nitride (TiN$_x$), platinum (Pt), tantalum (Ta), tantalum nitride (TaN$_x$), neodymium (Nd), scandium (Sc), strontium ruthenium oxide (SRO), zinc oxide (ZnO$_x$), indium tin oxide (ITO), tin oxide (SnO$_x$), indium oxide (InO$_x$), gallium oxide (GaO$_x$), indium zinc oxide (IZO), etc. These may be used alone or in a combination thereof. Also, the source and drain electrodes 144 and 142 may have a mono-layered structure or a multi-layered structure including a metal layer, an alloy layer, a metal nitride layer, a conductive metal oxide layer, and/or a transparent conductive material layer.

A data line (not shown) is formed from the same layer as the source and drain electrodes 144 and 142, and is electrically connected to the source electrode 144.

The planarizing layer 108 is formed on the insulating interlayer 106 on which the source and drain electrodes 144 and 142 and the data line (not shown) are on, to electrically insulate the source electrode 144 from the first electrode 146.

The planarizing layer 108 may include an organic insulating material or an inorganic insulating material. Examples of the insulating material that may be used for the planarizing layer 108 may include a photoresist, an acrylic resin, a polyimide resin, a polyamide resin, a siloxane resin, a photoresist acryl carboxyl resin, a novolak resin, an alkaline soluble resin, silicon compound, silicon nitride, silicon oxynitride, silicon carbon-oxide, silicon carbon-nitride, etc. These may be used alone or in a combination thereof.

The planarizing layer 108 has a contact hole through which the drain electrode 142 is exposed.

The first electrode 146 is disposed on the planarizing layer 108 corresponding to the pixel region, and is electrically connected to the drain electrode 142 through the contact hole of the planarizing layer 108.

When the OLED is a front illumination type, the first electrode 146 may include a reflective metal, a reflective alloy, etc. For example, the first electrode 146 may include silver, platinum, gold, chromium, tungsten, molybdenum, titanium, palladium, iridium, an alloy thereof, etc. These may be used alone or in a combination thereof. In another implementation, the first electrode 146 may include a transparent conductive material such as indium tin oxide, tin oxide, indium zinc oxide, zinc oxide, indium gallium oxide, gallium oxide, etc. These may be used alone or in a combination thereof.

The pixel defining layer 112 is disposed on the planarizing layer 108 on which the first electrode 146 is formed, to expose a portion of the first electrode 146. The pixel defining layer 112 may include an organic material or an inorganic material. Examples of the material that may be used for the pixel defining layer 112 may include a photoresist, a poly acrylic resin, a polyimide resin, an acrylic resin, a silicon compound, etc.

In an implementation, a display region and a non-display region may defined on the OLED by the exposed portion of the first electrode 146 that is exposed by the pixel defining layer 112. For example, the exposed portion of the first electrode 146, which is exposed by the pixel defining layer 112 corresponds to the display region. A remaining portion of the pixel defining layer 112 defines a non-display region.

The organic light emitting element 200 is disposed on the first electrode 146 that is exposed by the pixel defining layer 112. The second electrode 148 covers the organic light emitting element 200 and the pixel defining layer 112.

When the OLED is the front illumination type, the second electrode 148 may include a transparent conductive material. Examples of the transparent conductive material that may be used for the second electrode 148 may include indium tin oxide, tin oxide, indium zinc oxide, zinc oxide, indium gallium oxide, gallium oxide, etc. These may be used alone or in a combination thereof.

Figure 2:
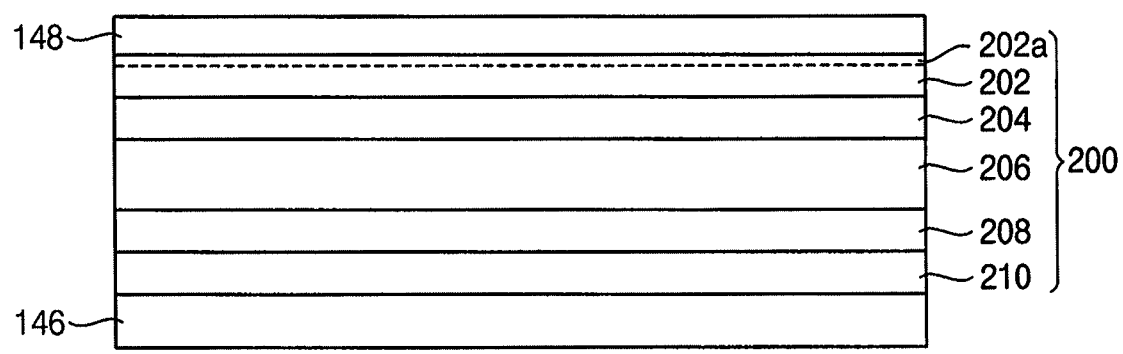
FIG. 2 is an enlarged cross-sectional view illustrating a portion 'A' of FIG. 1.

FIG. 2 is an enlarged cross-sectional view illustrating a portion 'A' of FIG. 1.

Referring to FIG. 2, the organic light emitting element 200 includes a chlorine-doped layer 202a, an electron injection layer 202, an electron transportation layer 204, a light emitting layer 206, a hole transportation layer 208 and a hole injection layer 210.

The hole injection layer 210 is disposed on the first electrode 146. The hole injection layer 210 may include a phthalocyanine compound such as copper phthalocyanine, TCTA such as starburst typed amine, m-MTDATA, m-MTDAPB, etc. The hole injection layer 210 increases mobility of holes from the first electrode 146 to improve electrical characteristics of the organic light emitting element 200.

The hole transportation layer 208 is disposed on the hole injection layer 210. The hole transportation layer 208 may include N,N'-bis(3-methylphenyl)-N,N'-diphenyl-[1,1-biphenyl]-4,4'-diamine (TPC), N,N'-di(naphthalene-1-yl)-N,N'-diphenyl benzidine (α-NPD), etc. The hole transportation layer 208 increases mobility of the holes from the hole injection layer 210 toward the light emitting layer 206.

The light emitting layer 206 is disposed on the hole transportation layer 208. For example, the light emitting layer 206 may include a host material and a dopant material.

Examples of the host material that may be used for the light emitting layer 206 may include tris(8-hydroxy-quinoline) aluminum (Alq3), 9,10-di(2-naphthyl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diallylfluorene)s (TDAF), 2-(9,9'-spirobfluorene-2-yl)-9,9'-spirobfluorene (TSDF), bis (9,9-diallylfluorene)s (BDAF), 4,4'-bis(2,2-diphenyl-ethene-1-yl)-4,4'-di-(tert-butyl)phenyl (p-TDPVBi), 1,2-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazole)fluorene (FL-4CBP), 4,4'-bis(carbazol-9-yl)-9,9-di-tolyl-fluorene (DPEL-CBP), 9,9-bis(9-phenyl-9H-carbazole)fluorene (FL-2CBP), etc.

Examples of the dopant that may be used for the light emitting layer 206 may include 4,4'-bis[4-(di-p-tolylamino) styryl]biphenyl (DPAVBi), 9,10-di(naph-2-thyl)anthracene (AND), 3-tert-butyl-9,10-di(naph-2-thyl)anthracene (TBADN), etc.

The electron transportation layer 204 is disposed on the light emitting layer 206. The electron transportation layer 204 may include Alq3. The electron transportation layer 204 increases mobility of electrons from the electron injection layer 202 toward the light emitting layer 206.

The electron injection layer 202 is disposed on the electron transportation layer 204. The electron injection layer 202 may include PBD (2-(4-biphenylyl)-5-(4-tert-butylphenyl)-1,3,4-oxadiazole), PF-6P (perfluoro-p-sexiphenyl), PyPySPyPy (2,5-bis(6'-(2',2''-bipyridyl))-1,1-dimethyl-3,4-diphenyl silacyclopentadiene), LiF, NaCl, CaF, $Li_2O$, BaO, Liq (lithium quinolate), etc. The electron injection layer 202 attracts electrons from the second electrode 148 so that the electrons may be easily transported toward the electron transportation layer 204.

The chlorine-doped layer 202a is between the second electrode 148 and the bulk of the electron injection layer 202. The chlorine-doped layer 202a is formed by doping chlorine at an upper portion of the electron injection layer 202. For example, the concentration of the doped chlorine in the chlorine-doped layer 202a is maximum at an interface between the chlorine-doped layer 202a and the second electrode 148, and decreases as a distance from the interface between the chlorine-doped layer 202a and the second electrode 148 increases. The concentration of the doped chlorine in the chlorine-doped layer 202a is minimum at an interface between the electron injection layer 202 and the chlorine-doped layer 202a. Alternatively, the chlorine-doped layer 202a may have a constant concentration. The chlorine-doped layer 202a increases electron attraction of the electron injection layer 202, thereby increasing electron mobility.

The hole injection layer 210, the hole transportation layer 208, the electron transportation layer 204, the electron injection layer 202, and the chlorine-doped layer 202a may enhance the electrical characteristics of the organic light emitting element 200 to increase luminance of the organic light emitting element 200, which may decrease power consumption and increase lifetime of the light emitting layer 206.

In an implementation, one or more of the hole injection layer 210, the hole transportation layer 208, and the electron transportation layer 204 may be omitted.

The second electrode 148 is disposed on the organic light emitting element 200. The second electrode 148 may include a transparent conductive material such as indium tin oxide, tin oxide, indium zinc oxide, zinc oxide, indium gallium oxide, gallium oxide, etc. These may be used alone or in a combination thereof. In another implementation, the second electrode 148 may include aluminum, silver, platinum, gold, chromium, tungsten, molybdenum, titanium, palladium, iridium, an alloy thereof, etc. These may be used alone or in a combination thereof.

Referring again to FIG. 1, the protection layer 150 is disposed on the second electrode 148. In an example embodiment, the protection layer 150 may include a photoresist, an acrylic resin, a polyimide resin, a polyamide resin, a siloxane resin, etc. In another implementation, the protection layer 150 may include a transparent insulating substrate. Examples of the transparent insulating substrate may include a glass substrate, a quartz substrate, a transparent resin substrate, etc.

Figure 3:
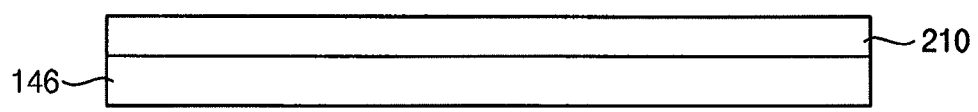
FIGS. 3 to 9 are cross-sectional views illustrating a method of manufacturing the OLED of FIG. 2 according to an example embodiment.

FIGS. 3 to 9 are cross-sectional views illustrating a method of manufacturing the OLED of FIG. 2 according to an example embodiment. FIG. 3 is a cross-sectional view illustrating forming the hole injection layer 210 on the first substrate 146.

Referring to FIG. 3, the hole injection layer 210 is formed on the first electrode 146. In the present example embodiment, a phthalocyanine compound, TCTA, m-MTDATA, m-MTDAPB, etc., may be used to form the hole injection layer 210. The hole injection layer 210 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, when the hole injection layer 210 is formed through the method using the mask, the mask having an opening a portion of the first electrode 146 is aligned on the substrate on which the first electrode 146 is formed, and then source material supplied by heating, sputtering, etc., is directly deposited on the first electrode 146 through the opening of the mask.

Figure 4:
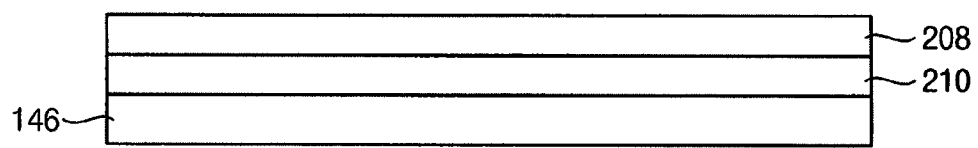

FIG. 4 is a cross-sectional view illustrating forming the hole transportation layer 208 on the hole injection layer 210 of FIG. 3.

Referring to FIG. 4, the hole transportation layer 208 is formed on the hole injection layer 210. The hole transportation layer 208 is formed using N,N'-bis(3-methylphenyl)-N, N'-diphenyl-[1,1-biphenyl]-4,4'-diamine (TPC), N,N'-di (naphthalen-1-yl)-N,N'-diphenyl benzidine (α-NPD), etc. The hole transportation layer 208 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, when the hole transportation layer 208 may be formed through the method using the mask.

Figure 5:
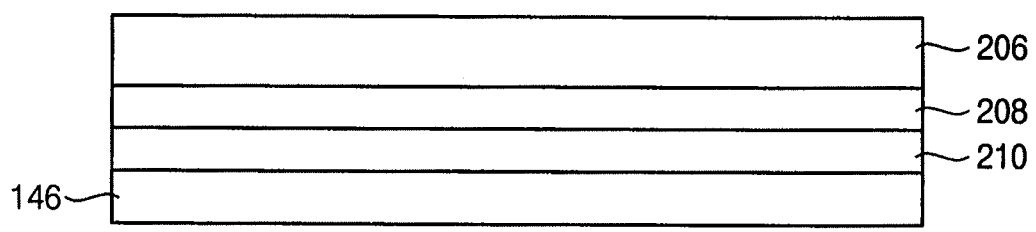

FIG. 5 is a cross-sectional view illustrating forming the light emitting layer 206 on the hole transportation layer 208.

Referring to FIG. 5, the light emitting layer 206 is formed on the hole transportation layer 208. For example, the light emitting layer 206 may be formed using the host material and the dopant material. The light emitting layer 206 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, when the light emitting layer 206 may be formed through the method using the mask. In an implementation, the light emitting layer 206 may be formed to have a stacked structure that includes a plurality of layers having different materials.

Figure 6:
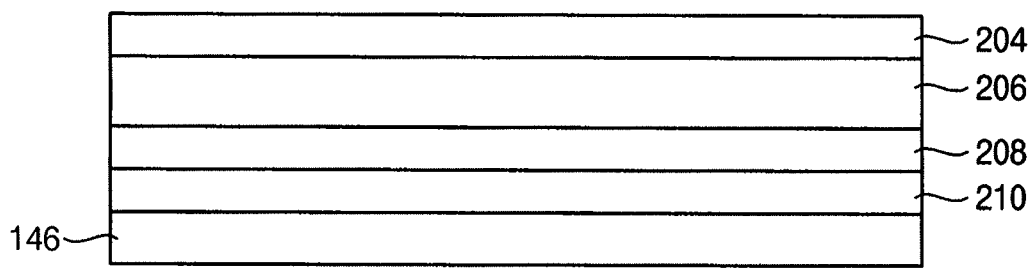

FIG. 6 is a cross-sectional view illustrating forming electron transportation layer 204 on the light emitting layer 206 of FIG. 5.

Referring to FIG. 6, the electron transportation layer 204 is formed on the light emitting layer 206. For example, the electron transportation layer 204 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, the electron transportation layer 204 may be formed through the method using the mask.

Figure 7:
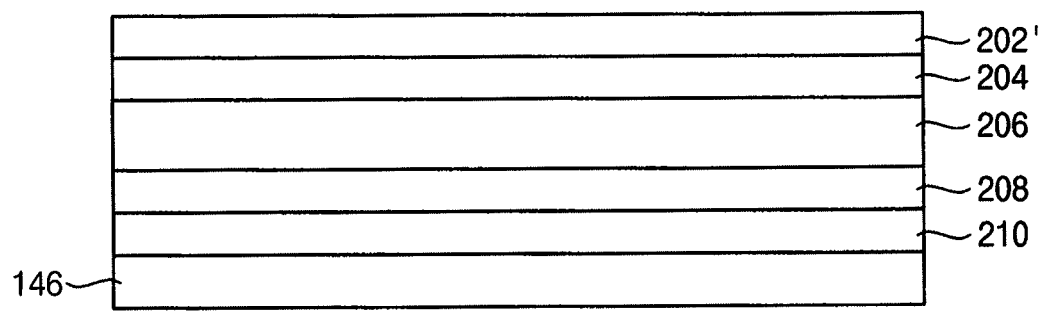

FIG. 7 is a cross-sectional view illustrating forming a primitive electron injection layer 202' on the electron transportation layer 204 of FIG. 6.

Referring to FIG. 7, the primitive electron injection layer 202' is formed on the electron transportation layer 204. For example, the primitive electron injection layer 202' may be formed using a source material such as PBD, PF-6P, PyPysPyPy, LiF, NaCl, CaF, $Li_2O$, BaO, Liq, etc. The primitive electron injection layer 202' may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, the primitive electron injection layer 202' may be formed through the method using the mask.

Figure 8:
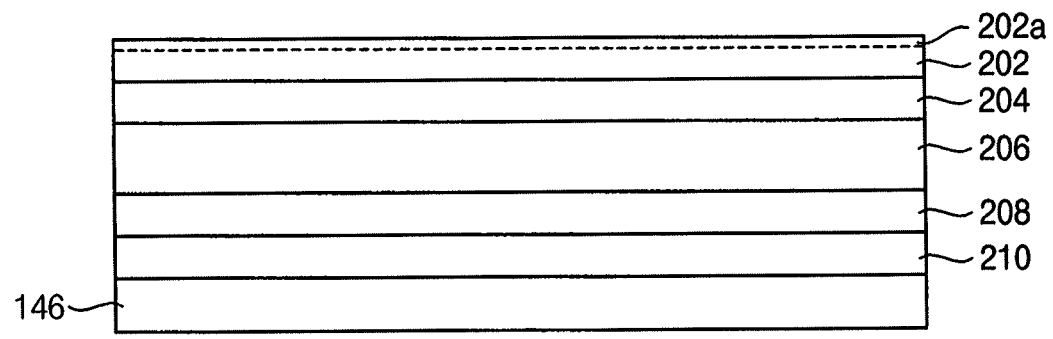

FIG. 8 is a cross-sectional view illustrating forming the chlorine-doped layer 202a at an upper portion of the primitive electron injection layer 202' of FIG. 7.

Referring to FIG. 8, a substrate on which the primitive electron injection layer 202' is disposed on a chamber (not shown). Chlorine gas or a chlorine composition gas is injected into the chamber. When the primitive electron injection layer 202' is exposed to the chlorine gas or the chlorine composition gas, the upper portion of the primitive electron injection layer 202' is doped by chlorine atoms. When the upper portion of the primitive electron injection layer 202' is doped by the chlorine atoms, the chlorine-doped layer 202a is formed at the upper portion of the primitive electron injection layer 202' and the electron injection layer 202 is formed at a remaining portion of the primitive electron injection layer 202'.

For example, the chlorine concentration in the chlorine-doped layer 202a is maximum at the interface between the chlorine-doped layer 202a and the second electrode 148. The chlorine concentration in the chlorine-doped layer 202a decreases as a distance from the interface between the chlorine-doped layer 202a and the second electrode 148 increases. The chlorine concentration in the chlorine-doped layer 202a is minimum at an interface between the electron injection layer 202 and the chlorine-doped layer 202a. Alternatively, the chlorine-doped layer 202a may be formed by an additional deposition process, and the chlorine-doped layer 202a may have the constant chlorine concentration.

Figure 9:
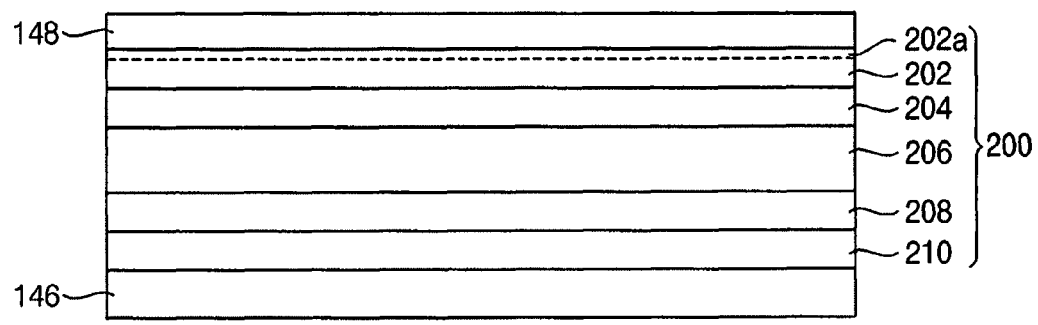

FIG. 9 is a cross-sectional view illustrating forming the second electrode 148 on the chlorine-doped layer 202a of FIG. 8.

Referring to FIG. 9, the second electrode 148 including the conductive material is formed on the chlorine-doped layer 202a. The second electrode 148 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, if the OLED is the front illumination type, the first and second electrodes 146 and 148 include the highly reflective material and the transparent conductive material. Examples of the highly reflective material that may be used for the first electrode 146 may include a metal such as aluminum, chromium, silver, gold, platinum, copper, titanium, nickel, iron, magnesium, etc., an alloy thereof, a composition thereof, etc. The highly reflective material that may be used for the first electrode 146 may have a reflectivity of about 75% to about 99.9% for visible light. In another implementation, the OLED may be a rear illumination type, and the first and second electrodes 146 and 148 may include the transparent conductive material and the highly reflective material, respectively.

According to the present example embodiment, the chlorine-doped layer 202a is formed on the electron injection layer 202 to attract the electrons from the second electrode 148. Thus, the electrical characteristics of the organic light emitting element 200 may be improved to increase luminance and to decrease power consumption.

Also, the chlorine-doped layer 202a may be formed in the same chamber as the primitive electron injection layer 202' in-situ, thereby simplifying manufacturing process and decreasing manufacturing cost.

Figure 10:
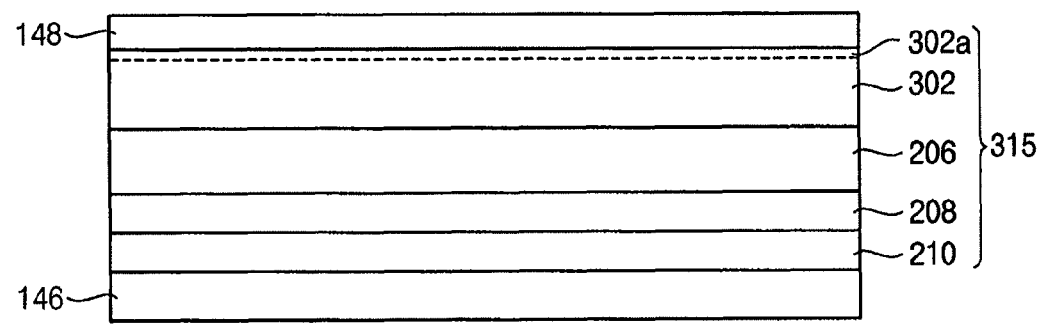
FIG. 10 is a cross-sectional view illustrating an OLED according to another example embodiment.

FIG. 10 is a cross-sectional view illustrating an OLED according to another example embodiment. The OLED of FIG. 10 is substantially the same as shown in FIGS. 1 to 9 except for the electron injection layer and the electron transportation layer. Thus, any repetitive explanations concerning the same elements will be omitted.

Referring to FIGS. 1 and 10, the OLED includes the base substrate 100, the buffer layer 102, the gate insulating layer 104, the insulating interlayer 106, the planarization layer 108, the pixel defining layer 112, the thin film transistor 130, the first electrode 146, the second electrode 148, an organic light emitting element 315, and the protection layer 150.

Referring again to FIG. 10, the organic light emitting element 315 includes a chlorine-doped layer 302a, an electron injection layer 302, the light emitting layer 206, the hole transportation layer 208, and the hole injection layer 210.

The hole injection layer 210, the hole transportation layer 208, and the light emitting layer 206 are stacked on the first electrode 146.

The electron injection layer 302 is disposed on the light emitting layer 206. The electron injection layer 302 may include the same material (such as Alq3) as the electron transportation layer 204 (shown in FIG. 2) or the same material (such as PBD, PF-6P, PyPySPyPy, LiF, NaCl, CaF, Li$_2$O, BaO, Liq, etc.) as the electron injection layer 202 (shown in FIG. 2). The electron injection layer 302 attracts electrons from the second electrode 148 so that the electrons may be easily transported toward the light emitting layer 206.

The chlorine-doped layer 302a is disposed on the electron injection layer 302. The chlorine-doped layer 302a is formed by doping chlorine at an upper portion of the electron injection layer 302. The chlorine-doped layer 302a increases electron attraction of the electron injection layer 302, which may increase electron mobility.

In the present example embodiment, the method of manufacturing the OLED is substantially the same as the method shown in FIGS. 3 to 9 except the forming of the electron injection layer 302 and the forming the chlorine-doped layer 302a. Thus, any repetitive explanation concerning the same elements will be omitted.

After the light emitting layer 206 is formed, a primitive electron injection layer (not shown) is formed on the light emitting layer 206. For example, the primitive electron injection layer (not shown) may be formed using a source material such as Alq3, PBD, PF-6P, PyPysPyPy, LiF, NaCl, CaF, Li$_2$O, BaO, Liq, etc. The primitive electron injection layer (not shown) may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, the primitive electron injection layer (not shown) may be formed through the method using the mask.

A substrate on which the primitive electron injection layer (not shown) is disposed on a chamber (not shown). Chlorine gas or a chlorine composition gas is injected into the chamber. When the primitive electron injection layer (not shown) is exposed to the chlorine gas or the chlorine composition gas, the upper portion of the primitive electron injection layer (not shown) is doped by chlorine molecules. When the upper portion of the primitive electron injection layer (not shown) is doped by the chlorine molecules, the chlorine-doped layer 302a is formed at the upper portion of the primitive electron injection layer (not shown) and the electron injection layer 302 is formed at a remaining portion of the primitive electron injection layer (not shown).

The second electrode 148 including the conductive material is formed on the chlorine-doped layer 302a. The second electrode 148 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, the OLED is the front illumination type, and the first and second electrodes 146 and 148 include the highly reflective material and the transparent conductive material, respectively. In another implementation, the OLED may be a rear illumination type, and the first and second electrodes 146 and 148 may include the transparent conductive material and the highly reflective material, respectively.

According to the present example embodiment, the electron transportation layer 204 (shown in FIG. 2) is integrally foamed with the electron injection layer 202 (shown in FIG. 2) to form the single electron injection layer 302. Thus, the manufacturing process may be simplified, and the manufacturing cost may be decreased.

Figure 11:
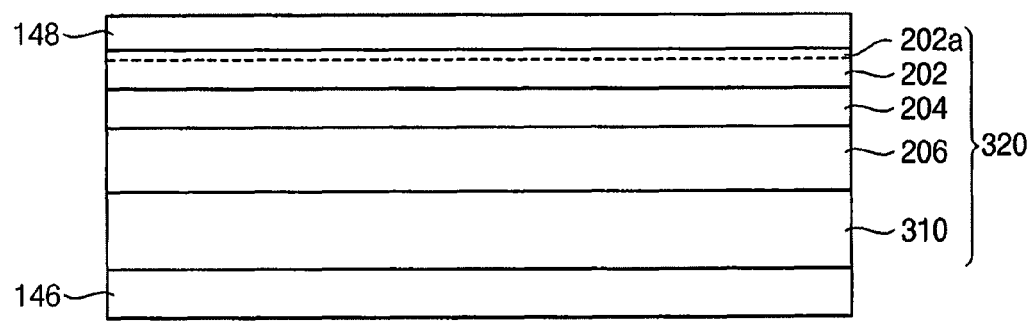
FIG. 11 is a cross-sectional view illustrating an OLED according to still another example embodiment.

FIG. 11 is a cross-sectional view illustrating an OLED according to still another example embodiment. The OLED of FIG. 11 is substantially the same as shown in FIGS. 1 to 9 except for the hole injection layer and the hole transportation layer. Thus, any repetitive explanations concerning the same elements will be omitted.

Referring to FIGS. 1 and 11, an organic light emitting element 320 includes the chlorine-doped layer 202a, the electron injection layer 202, the electron transportation layer 204, the light emitting layer 206, and a hole injection layer 310.

Referring to FIG. 11, the hole injection layer 310 may include the same material (such as a phthalocyanine compound such as copper phthalocyanine, TCTA such as starburst typed amine, m-MTDATA, m-MTDAPB, etc.) as the hole injection layer 210 (shown in FIG. 2) or the same material (such as N,N'-bis(3-methylphenyl)-N,N'-diphenyl-[1,1-biphenyl]-4,4'-diamine (TPC), N,N'-di(naphthalene-1-yl)-N,N'-diphenyl benzidine (α-NPD), etc.) as the hole transportation layer 208 (shown in FIG. 2). These may be used alone or in a combination thereof.

In the present example embodiment, the method of manufacturing the OLED is substantially the same as the method shown in FIGS. 3 to 9 except for the forming of the hole injection layer 210 (shown in FIG. 2) and the forming the hole transportation layer 208 (shown in FIG. 2). Thus, any repetitive explanation concerning the same elements will be omitted.

The hole injection layer 310 is formed on the first electrode 146. The hole injection layer 310 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, the hole injection layer 310 is formed through the method using the mask.

The light emitting layer 206, the electron transportation layer 204, and the primitive electron injection layer 202' (shown in FIG. 7) are stacked on the hole injection layer 310.

Chlorine is doped on the primitive electron injection layer 202' (shown in FIG. 7) to form the chlorine-doped layer 202a and the electron injection layer 202.

The second electrode 148 is formed on the chlorine-doped layer 202a.

According to the present example embodiment, the hole transportation layer 208 (shown in FIG. 2) is integrally formed with the hole injection layer 210 (shown in FIG. 2) to form the single hole injection layer 310. Thus, the manufacturing process may be simplified, and the manufacturing cost may be decreased.

Figure 12:
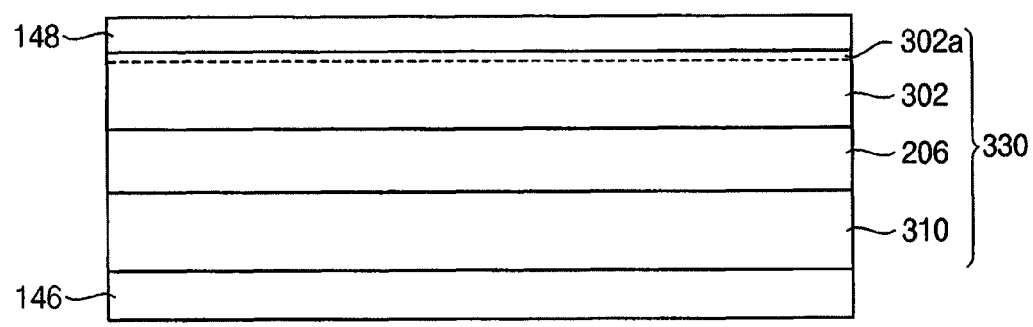
FIG. 12 is a cross-sectional view illustrating an OLED according to still another example embodiment.

FIG. 12 is a cross-sectional view illustrating an OLED according to still another example embodiment. The OLED of FIG. 12 is substantially the same as shown in FIGS. 1 to 9 except the hole injection layer, the hole transportation layer, the electron injection layer and the electron transportation layer. Thus, any repetitive explanations concerning the same elements will be omitted.

Referring to FIG. 12, an organic light emitting element 330 includes the chlorine-doped layer 302a, the light emitting layer 206, and the hole injection layer 310.

The electron injection layer 302 includes the material used for the electron injection layer 202 of FIG. 2 or the material used for the electron transportation layer 204.

The hole injection layer 310 includes the material used for the hole injection layer 210 of FIG. 2 or the material used for the hole transportation layer 208 of FIG. 2.

In the present example embodiment, the method of manufacturing the OLED is substantially the same as the method shown in FIGS. 3 to 9 except for the forming of the chlorine-doped layer 302a and the electron injection layer 302, and the hole injection layer 310. The forming of the chlorine-doped layer 302a and the electron injection layer 302 of FIG. 12 is substantially the same as in FIG. 10. The forming the hole injection layer 310 of FIG. 12 is substantially the same as in FIG. 11. The forming the light emitting layer 206 is substantially the same as in FIG. 5. Thus, any repetitive explanation concerning the same elements will be omitted.

According to the present example embodiment, the electron transportation layer 204 (shown in FIG. 2) is integrally formed with the electron injection layer 202 (shown in FIG. 2) to form the single electron injection layer 302. Also, the hole transportation layer 208 (shown in FIG. 2) is integrally formed with the hole injection layer 210 (shown in FIG. 2) to form the single hole injection layer 310. Thus, the manufacturing process may be simplified, and the manufacturing cost may be decreased.

Figure 13:
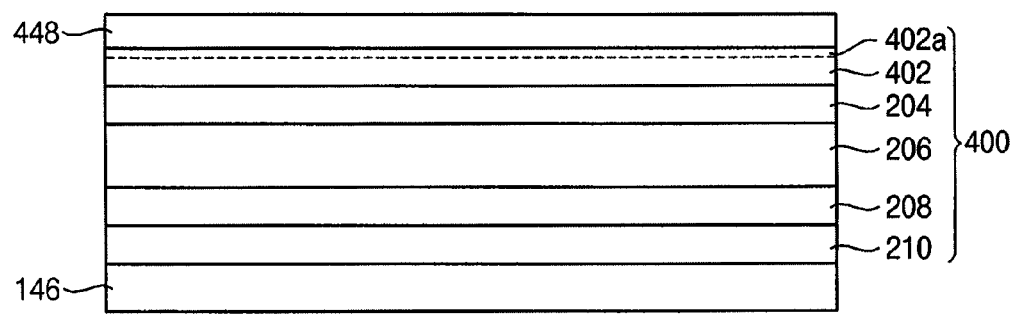
FIG. 13 is a cross-sectional view illustrating an OLED according to still another example embodiment.

FIG. 13 is a cross-sectional view illustrating an OLED according to still another example embodiment. The OLED of FIG. 13 is substantially the same as shown in FIGS. 1 to 9 except for an electron injection layer 402, a chlorine-doped layer 402a, and a second electrode 448. Thus, any repetitive explanations concerning the same elements will be omitted.

Referring to FIGS. 1 and 13, the OLED includes the base substrate 100, the buffer layer 102, the gate insulating layer 104, the insulating interlayer 106, the planarization layer 108, the pixel defining layer 112, the thin film transistor 130, the first electrode 146, the second electrode 148, an organic light emitting element 400, and the protection layer 150.

Referring again to FIG. 13, the organic light emitting element 400 includes a chlorine-doped layer 402a, an electron injection layer 402, the light emitting layer 206, the hole transportation layer 208, and the hole injection layer 210.

The hole injection layer 210, the hole transportation layer 208, and the light emitting layer 206 are stacked on the first electrode 146.

The electron injection layer 402 is disposed on the electron transportation layer 204. The electron injection layer 402 may include PBD, PF-6P, PyPySPyPy, LiF, NaCl, CaF, $Li_2O$, BaO, Liq, etc. The electron injection layer 402 attracts electrons from the second electrode 148 so that the electrons may be easily transported toward the electron transportation layer 204.

The chlorine-doped layer 402a is disposed on the electron injection layer 402. The chlorine-doped layer 402a is formed by doping chlorine during forming the second electrode 448. The chlorine-doped layer 402a increases electron attraction of the electron injection layer 402, thereby increasing electron mobility.

In an implementation, one or more of the hole injection layer 210, the hole transportation layer 208, and the electron transportation layer 204 may be omitted.

The second electrode 148 including the conductive material is formed on the organic light emitting element 400. The second electrode 148 may include chlorine and a transparent conductive material such as indium tin oxide, tin oxide, indium zinc oxide, zinc oxide, indium gallium oxide, gallium oxide, etc. The transparent conductive material except the chlorine may be used alone or in a combination thereof. In another implementation, the second electrode 148 may include the chlorine and a metal such as aluminum, silver, platinum, gold, chromium, tungsten, molybdenum, titanium, palladium, iridium, an alloy thereof, etc. The metal except the chlorine may be used alone or in a combination thereof.

Referring again to FIG. 1, the protection layer 150 is disposed on the second electrode 148.

Figure 14:
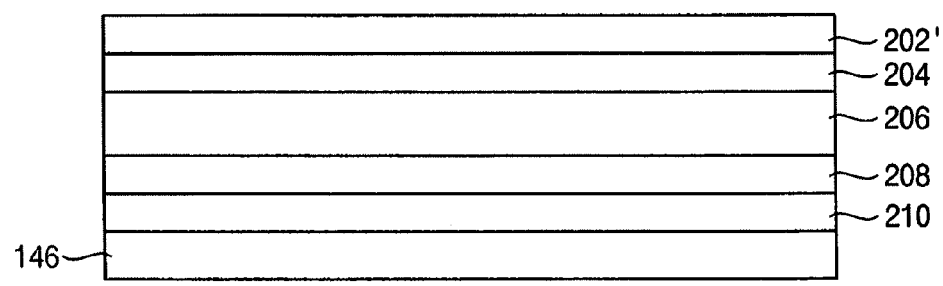
FIGS. 14 and 15 are cross-sectional views illustrating a method of manufacturing the OLED of FIG. 13 according to an example embodiment.
Figure 15:
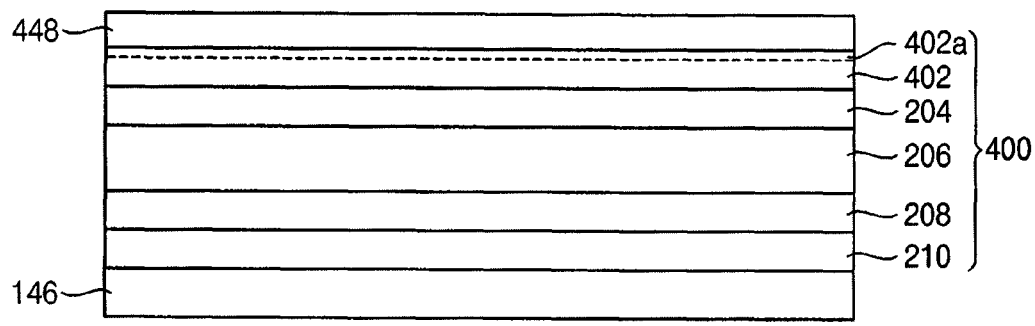

FIGS. 14 and 15 are cross-sectional views illustrating a method of manufacturing the OLED of FIG. 13. FIG. 14 is a cross-sectional view illustrating forming a primitive electron injection layer 202'.

The forming the primitive electron injection layer 202' is substantially the same as in FIG. 7. Thus, any repetitive explanation concerning the same elements will be omitted.

FIG. 15 is a cross-sectional view illustrating simultaneously forming the chlorine-doped layer 402a and the second electrode 448 using the primitive electron injection layer 202a' of FIG. 14.

Referring to FIG. 15, a substrate on which the primitive electron injection layer 202' is disposed is placed in a chamber (not shown). The second electrode 448 is formed on the primitive electron injection layer 202' using a chlorine atmosphere in which chlorine gas or a chlorine composition gas is injected into the chamber. The second electrode 148 may be formed through a deposition method, a method for forming a layer using a mask, a method for forming a layer using a photoresist, a printing method, an inkjet method, etc. The deposition method may include a sputtering method, a chemical vapor deposition method, a pulse laser deposition method, a vacuum deposition method, an atomic layer deposition (ALD), etc. For example, if the OLED is a front illumination type, the first and second electrodes 146 and 148 may include a highly reflective material and a transparent conductive material, respectively. In another implementation, the OLED may be a rear illumination type, and the first and second electrodes 146 and 148 may include the transparent conductive material and the highly reflective material, respectively.

The primitive electron injection layer 202' is exposed to the chlorine gas or the chlorine composition gas during the forming the second electrode 448, so that the upper portion of the primitive electron injection layer 202' is doped by the chlorine molecules. When the upper portion of the primitive electron injection layer 202' is doped by the chlorine molecules, the chlorine-doped layer 402a is formed at the upper portion of the primitive electron injection layer 202' and the electron injection layer 402 is formed at a remaining portion of the primitive electron injection layer 202'.

According to the present example embodiment, the second electrode 448 is formed using the chlorine atmosphere, so that the chlorine-doped layer 402a is simultaneously formed with the second electrode 448. Thus, the manufacturing process may be simplified and the manufacturing cost may be decreased.

Figure 16:
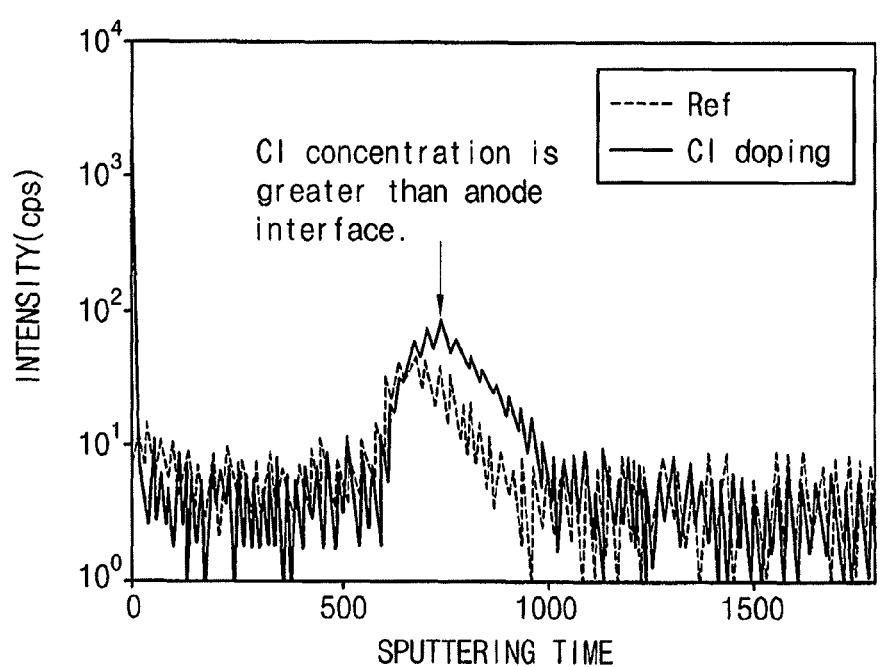
FIG. 16 is a graph illustrating a time-of-flight secondary ion mass spectrometry (TOF-SIMS) of the OLED of FIG. 1.

FIG. 16 is a graph illustrating a time-of-flight secondary ion mass spectrometry (TOF-SIMS) of the OLED of FIG. 1. Horizontal axis of FIG. 16 illustrates sputtering time, and vertical axis of FIG. 16 illustrates intensity of chlorine doping.

Referring to FIG. 16, the TOF-SIMS was performed to compare the electron injection layer doped by chlorine as shown in FIGS. 1 to 9 with an electron injection layer without the chlorine. The chlorine concentration was high at a boundary between the second electrode and the electron injection layer. That is, the chlorine concentration was maximum at the boundary between the second electrode and the electron injection layer. The chlorine concentration decreased as a distance from the boundary between the second electrode and the electron injection layer was increased. The chlorine concentration was minimum at a boundary between the electron injection layer and the chlorine-doped layer.

The above-mentioned distribution of the chlorine concentration was the result of the chlorine doping after forming the primitive electron injection layer.

Figure 17:
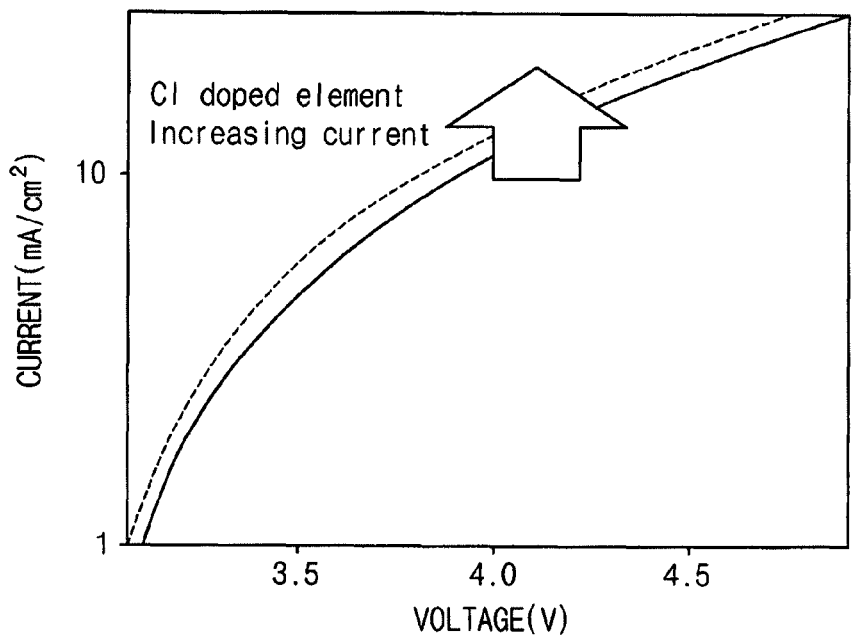
FIG. 17 is a graph illustrating a relationship between voltage and current applied to an organic light emitting element of the OLED of FIG. 1 and an organic light emitting element without chlorine-doped layer.

FIG. 17 is a graph illustrating a relationship between voltage and current applied to an organic light emitting element of the OLED of FIG. 1 and an organic light emitting element without chlorine-doped layer. The horizontal axis of FIG. 17 illustrates voltage (V), and the vertical axis of FIG. 17 illustrates current flowing in an organic light emitting element of a unit area ($mA/cm^2$).

Referring to FIG. 17, when the chlorine was doped into the electron injection layer, current was increased compared with the electron injection layer without chlorine. For example, when the voltage applied to the organic light emitting element was 3.7 V, a current flowing through the organic light emitting element having the electron injection layer without chlorine was 8.5 $mA/cm^2$. However, the current flowing through the organic light emitting element having the chlorine-doped layer was 10.0 $mA/cm^2$ at the voltage of 3.7 V. That is, the current of the chlorine-doped layer was increased by 17.6%.

Therefore, when the chlorine was doped into the electron injection layer, the electron attraction was increased and power consumption was decreased.

Figure 18:
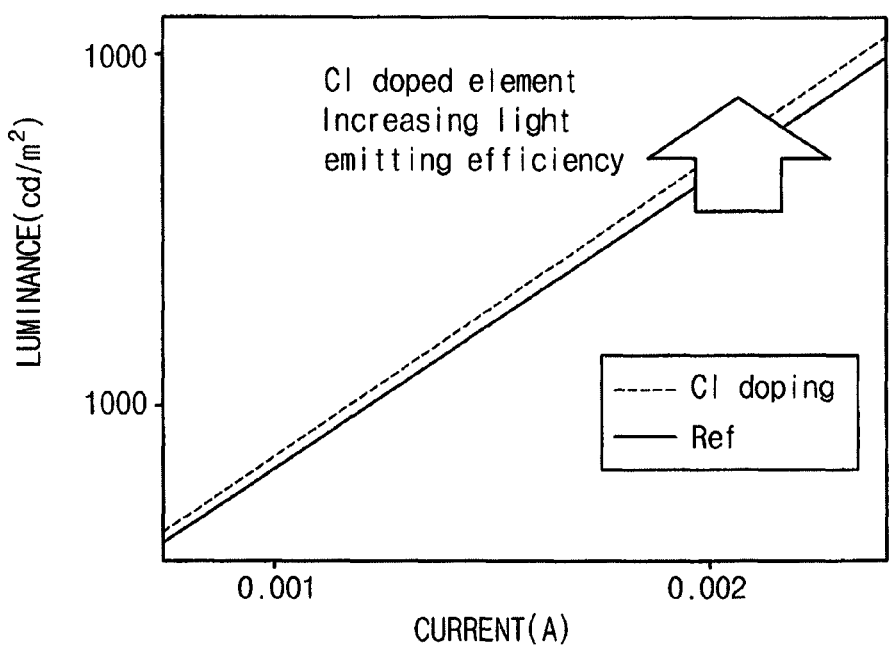
FIG. 18 is a graph illustrating a relationship between current and luminance of an organic light emitting element of the OLED of FIG. 1 and an organic light emitting element without chlorine-doped layer.

FIG. 18 is a graph illustrating a relationship between current and luminance of an organic light emitting element of the OLED of FIG. 1 and an organic light emitting element without chlorine-doped layer. The horizontal axis of FIG. 18 illustrates current (A), and the vertical axis of FIG. 18 illustrates luminance ($Cd/m^2$) of an organic light emitting element.

Referring to FIG. 18, when the organic light emitting element includes the chlorine-doped layer, luminance was increased at the same current. For example, when the current flowing through the organic light emitting element was 0.0015 A, the luminance of the organic light emitting element without the chlorine-doped layer was 1,245 $Cd/m^2$. However, the luminance of the organic light emitting element having the chlorine-doped layer was 1,290 $Cd/m^2$ at the current of 0.0015 A. That is, the luminance of the organic light emitting element having the chlorine-doped layer was increased by 45 $Cd/m^2$ compared with the organic light emitting element without the chlorine-doped layer.

Therefore, the current for generating light of same luminance is decreased, thereby power consumption is decreased.

By way of summation and review, an OLED may include the organic light emitting element including two electrodes and an organic light emitting layer interposed between the two electrodes. In order to increase luminance of the organic light emitting element and to decrease power consumption of the organic light emitting element, a hole injection layer, an electron transportation layer, etc., may be disposed on the organic light emitting layer. A general electron transportation layer may include metal ions such as lithium fluoride (LiF), cesium fluoride (CsF), etc. However, the rare earth metal such as the lithium (Li), cesium (Cs), etc., may pollute the environment, and may not be securely acquired. Also, increases in the price of the rare earth metal may result in the price of the OLED being increased. Furthermore, even when the rare earth metal is used for the organic light emitting element, the increase of the luminance and the decrease of the power consumption may be limited.

As described above, embodiments relate to an organic light emitting display apparatus that may provide improved luminance and light emitting efficiency, and a method of manufacturing the organic light emitting display apparatus. Some example embodiments may provide an organic light emitting display apparatus having improved luminance and light emitting efficiency. The OLED may include a chlorine-doped layer, which may increase luminance and light emitting efficiency. According to example embodiments, the chlorine-doped layer may be formed at the upper portion of the electron injection layer, thereby increasing the electron attraction. Thus, the electrons may be easily attracted from the second electrode. Thus, electrical characteristics of the organic light emitting element may be improved, thereby increasing luminance and decreasing power consumption.

Also, the chlorine-doped layer may be simultaneously formed with the primitive electron injection layer in the same chamber in-situ, thereby simplifying manufacturing process and decreasing manufacturing cost. Furthermore, the second electrode may be formed at the chlorine atmosphere in which the chlorine gas or the chlorine composition gas was injected into the chamber, the chlorine-doped layer may be formed with the second electrode through the same process. Thus, manufacturing process may be simplified, and manufacturing cost may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
a first electrode;
a hole injection layer disposed on the first electrode;
a light emitting layer disposed on the hole injection layer;
an electron injection layer disposed on the light emitting layer;
a chlorine-doped layer disposed on the electrode injection layer and including chlorine and a same material as the electron injection layer; and
a second electrode disposed on the chlorine-doped layer,
wherein the chlorine-doped layer is disposed between the electron injection layer and the second electrode.

2. The organic light emitting display apparatus of claim 1, further comprising an electron transportation layer interposed between the light emitting layer and the electron injection layer.

3. The organic light emitting display apparatus of claim 1, further comprising a hole transportation layer interposed between the hole injection layer and the light emitting layer.

4. The organic light emitting display apparatus of claim 1, wherein the electron injection layer includes at least one selected from the group of Alq3, PBD, PF-6P, PyPysPyPy, LiF, NaCl, CaF, $Li_2O$, BaO, and Liq.

5. The organic light emitting display apparatus of claim 4, wherein the chlorine-doped layer includes chlorine and at least one selected from the group of Alq3, PBD, PF-6P, PyPysPyPy, LiF, NaCl, CaF, $Li_2O$, BaO, and Liq.

6. The organic light emitting display apparatus of claim 1, wherein chlorine concentration in the chlorine-doped layer is maximum at a boundary between the chlorine-doped layer and the second electrode.

7. The organic light emitting display apparatus of claim 6, wherein the chlorine concentration in the chlorine-doped layer decreases as a distance from the boundary between the chlorine-doped layer and the second electrode increases.

8. The organic light emitting display apparatus of claim 1, wherein the second electrode includes a transparent conductive material.

9. The organic light emitting display apparatus of claim 1, wherein the second electrode includes a highly reflective material.

10. The organic light emitting display apparatus of claim 1, wherein the second electrode includes chlorine.

11. The organic light emitting display apparatus of claim 1, further comprising:
   a thin film transistor electrically coupled to the first electrode;
   a base substrate supporting the thin film transistor; and
   a protection layer covering the second electrode.

12. A method of manufacturing an organic light emitting display apparatus, the method comprising:
   forming a first electrode on a base substrate;
   forming a hole injection layer on the first electrode;
   forming a light emitting layer on the hole injection layer;
   forming a primitive electron injection layer on the light emitting layer;
   doping chlorine on an upper portion of the primitive electron injection layer to form a chlorine-doped layer at the upper portion of the primitive electron injection layer and an electron injection layer at a remaining portion of the primitive electron injection layer, the chlorine-doped layer including the chlorine and a same material as the primitive electron injection layer; and
   forming a second electrode on the chlorine-doped layer,
   wherein the chlorine-doped layer is disposed between the electron injection layer and the second electrode.

13. The method of claim 12, further comprising forming a hole transportation layer on the hole injection layer, wherein the light emitting layer is formed on the hole transportation layer.

14. The method of claim 12, further comprising forming an electron transportation layer on the light emitting layer, wherein the primitive electron injection layer is formed on the electron transportation layer.

15. The method of claim 14, wherein the primitive electron injection layer is formed by depositing at least one selected from the group of PBD, PF-6P, PyPySPyPy, LiF, CaF, $Li_2O$, BaO, and Liq.

16. The method of claim 12, wherein the chlorine-doped layer is formed from the electron injection layer using chlorine gas or a chlorine composition gas.

17. A method of manufacturing an organic light emitting display apparatus, the method comprising:
   forming a first electrode on a base substrate;
   forming a hole injection layer on the first electrode;
   forming a light emitting layer on the hole injection layer;
   forming a primitive electron injection layer on the light emitting layer; and
   depositing a conductive material on the primitive electron injection layer in a chlorine atmosphere to form a chlorine-doped layer at an upper portion of the primitive electron injection layer, an electron injection layer at a remaining portion of the primitive electron injection layer, and a second electrode on the chlorine-doped layer, the chlorine-doped layer including the chlorine and a same material as the primitive electron injection layer,
   wherein the chlorine-doped layer is disposed between the electron injection layer and the second electrode.

18. The method of claim 17, wherein the chlorine-doped layer, the electron injection layer, and the second electrode are formed in-situ.

19. The method of claim 17, wherein the chlorine-doped layer, the electron injection layer, and the second electrode are formed by depositing a transparent conductive material on the primitive electron injection layer in a chlorine gas or chlorine composition gas atmosphere.

20. The method of claim 17, wherein the chlorine-doped layer, the electron injection layer, and the second electrode are formed by depositing a highly reflective metal on the primitive electron injection layer in a chlorine gas or chlorine composition gas atmosphere.

* * * * *